United States Patent [19]

Cook, Jr. et al.

[11] 4,056,415
[45] Nov. 1, 1977

[54] METHOD FOR PROVIDING ELECTRICAL ISOLATING MATERIAL IN SELECTED REGIONS OF A SEMICONDUCTIVE MATERIAL

[75] Inventors: Charles R. Cook, Jr., North Palm Beach; Aung San U; Raymond E. Scherrer, both of West Palm Beach, all of Fla.

[73] Assignee: International Telephone and Telegraph Corporation, Nutley, N.J.

[21] Appl. No.: 705,632

[22] Filed: July 15, 1976

Related U.S. Application Data

[62] Division of Ser. No. 601,855, Aug. 4, 1975, abandoned.

[51] Int. Cl.² .......................................... H01L 21/20
[52] U.S. Cl. ................................... 148/187; 148/175; 204/38 A; 204/129.3; 357/53; 357/56
[58] Field of Search .................. 148/187, 175; 357/50, 357/53; 204/38 A, 129.3

[56] References Cited

U.S. PATENT DOCUMENTS

| 3,354,360 | 11/1967 | Campagna et al. | 357/50 X |
|---|---|---|---|
| 3,442,011 | 5/1969 | Strieter et al. | 357/53 X |
| 3,534,234 | 10/1970 | Clevenger | 148/175 X |
| 3,640,806 | 2/1972 | Watanabe et al. | 204/38 A |
| 3,648,125 | 3/1972 | Peltzer | 357/53 |
| 3,649,386 | 3/1972 | Murphy | 148/187 |
| 3,861,968 | 1/1975 | Magdo et al. | 148/175 X |
| 3,919,060 | 11/1975 | Pogge et al. | 204/129.3 |
| 3,954,523 | 5/1976 | Magdo et al. | 148/175 |

Primary Examiner—G. Ozaki
Attorney, Agent, or Firm—John T. O'Halloran; Peter C. Van Der Sluys

[57] ABSTRACT

An integrated circuit having dielectric isolation is fabricated by growing a double epitaxial layer of N-type semiconductive material onto a P-type substrate. A dielectric layer is formed over the epitaxial layer and thereafter the dielectric and a portion of the epitaxial growth are removed in selected isolation regions to expose the semiconductive material. A dielectric is formed by anodizing the N-type semiconductive material in the selected isolation regions to provide electrical isolation between the remaining portions of the epitaxial growth. Base and emitter elements are formed in the conventional manner to complete the integrated circuit which is thereafter packaged.

39 Claims, 11 Drawing Figures

METHOD FOR PROVIDING ELECTRICAL ISOLATING MATERIAL IN SELECTED REGIONS OF A SEMICONDUCTIVE MATERIAL

This is a division of application Ser. No. 601,855, filed Aug. 4, 1975, now abandoned in favor of continuing application Ser. No. 780,895, filed Mar. 24, 1977.

BACKGROUND OF THE INVENTION

1. Field of the Invention

This invention relates generally to a method for providing electrical insulating material in selected regions of a semiconductive material and more particularly to a method for fabricating an integrated circuit having electrical isolation between functional elements thereof.

2. Description of the Prior Art

Heretofore a number of methods have been used to provide isolation between functional elements in integrated circuit devices; however, most of these have proven to be either ineffective or impractical due to high cost.

A first isolating method provided isolation using back to back PN junctions. The junctions were formed by diffusing P-type impurities into an N-type epitaxial layer until the P-type diffusion extended through the entire epitaxial layer to a P-type substrate. In order to achieve high saturation currents, a layer of high concentration N-type impurity is usually formed by diffusion prior to growing the epitaxial layer. Since it is difficult to diffuse sufficient P-type impurities through the epitaxial layer to overcome the high concentration of N-type, it was essential that a mask be used during the diffusion of the N-type impurities so that the high concentration was not present in the regions where P-type impurities were to be diffused. Thus, two diffusion steps were required, each step requiring a separate mask. The need for two masks and two high temperature diffusion steps increased the cost of the fabricated device and also degraded the semiconductor material.

In an attempt to eliminate a masking operation and one of the high temperature diffusion steps, a double epitaxial layer of N-type semiconductivity was formed on a P-type substrate. A first layer had a high N-type impurity concentration and the second layer a standard N-type impurity concentration. The isolation was provided by P-type diffusion through the double epitaxial layer to the P-type substrate to form PN junctions; however, it was difficult to properly diffuse P-type impurities through the high N-type impurity concentration in the first epitaxial layer. As a result, the P-type diffusion step had to extend over long periods of time that proved impractical and contributed to the degradation of the semiconductor material.

In a third method for providing isolation, the silicon in the isolating region was partially etched and thereafter oxidized to form a dielectric, silicon dioxide; however, it was discovered that in order to provide the proper thickness of silicon dioxide, an oxidation period of approximately 10 hours at 1,000° C was required and this also proved to be both time consuming and detrimental to the semiconductor material.

Another method of providing isolation required the formation of channels or valleys in a single crystal semiconductor material. A layer of polycrystalline silicon was then formed over the channels. The single crystal silicon was lapped off to expose isolating regions of polycrystalline silicon which formed a substrate having isolated regions of single crystal silicon which formed the active elements of the circuit. This lapping process proved to be extremely expensive and time consuming and did not provide a satisfactory solution to the isolation requirement.

Thus, all the prior art methods suffered from some deficiency. The methods were either time consuming, too expensive or degraded the semiconductor material due to excessive exposure to extreme temperatures.

In commonly assigned copending United States application Ser. No. 524,296, filed Nov. 15, 1974 now U.S. Pat. No. 4,005,452 issued Jan. 25, 1977, the use of an anodized metal for providing electrical isolation between functional elements in an integrated circuit is taught. An anodized metal dielectric provided satisfactory isolation and eliminated the difficulties encountered with PN junction isolation techniques and the resulting capacitance formed across the junction. In order to provide an anodic film thick enough to completely isolate the functional elements, a porous anodic film was required. Because of the porosity, the film could be developed to the thickness required for isolation purposes. It was discovered that a porous anodic film would result if the proper type of electrolyte was used during anodization.

SUMMARY OF THE INVENTION

The present invention contemplates the use of an anodized semiconductive material as an isolating dielectric between the functional elements of an integrated circuit. Anodized semiconductive material such as silicon provides advantages similar to those realized when using anodized aluminum; however, the process is simplified and less costly. When anodized silicon is used for isolation there is no need for depositing aluminum and the silicon in the selected isolation regions does not have to be etched entirely away.

A double epitaxial layer of N-type semiconductivity material is grown onto a P-type substrate, one of said epitaxial layers adjacent the P-type substrate has a high concentration of N-type impurities to provide collector elements with low resistance. The outer surface of the epitaxial layer is oxidized to form a protective dielectric layer of oxide. The oxide layer and a portion of the epitaxial layer are etched away in selected isolation regions between the collector elements to expose an N-type semiconductive material.

Anodization is then performed by submerging the substrate into an electrolyte which results in a porous film of anodized silicon. The following acids form preferred electrolytes: boric, sulfuric, phosphoric, or nitric. It is possible to practice the invention, with almost any acid as an electrolyte if it is properly diluted and used at the correct temperature and current levels. An anodizing potential is applied to the substrate and the electrolyte in such a manner that the substrate and the exposed silicon in the selected isolation regions form an anode for anodizing the silicon. The silicon that is under the oxide film is protected and is therefore not anodized during the anodization process except for a slight amount of lateral anodization. The porous anodized silicon is hardened during subsequent high temperature process steps.

Thus, the present invention eliminates two high temperature diffusion steps and one masking operation thereby reducing the cost of the integrated circuit device and reducing the degradation normally resulting from high temperature diffusion steps.

The base and emitter regions of the functional elements may be formed in the conventional manner either prior to or after forming the isolation regions.

In a further embodiment, it is contemplated that after anodization a P-type dopant such as boron is introduced into the anodized silicon. The dopant may be introduced directly from impurities placed in the electrolyte or may be deposited on the anodized silicon. Said dopant diffuses through the porous anodized silicon to the interface with the unanodized silicon where it functions to prevent inversion of the P-type substrate to N-type during subsequent process steps for forming base and emitter regions.

The primary objective of the present invention is to provide a method for forming electrical isolation regions in semiconductor material.

Another objective of the present invention is to provide a process for forming electrical isolation regions between functional elements in an integrated circuit device.

Another objective of the present invention is to provide a semiconductor device that is less expensive and more reliable than those heretofore provided.

The foregoing and other objectives and advantages of the present invention will become more apparent from the following description and the accompanying drawings wherein one embodiment of the present invention is described.

DESCRIPTION OF THE PREFERRED EMBODIMENT

Figure 1:
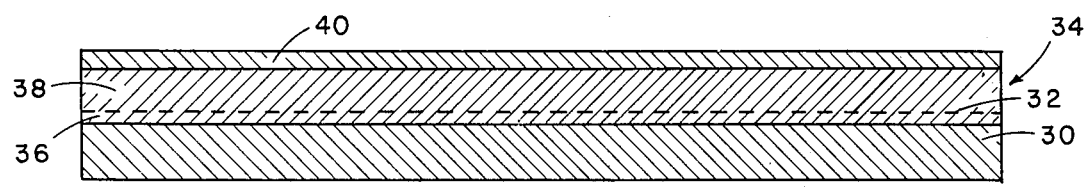
FIGS. 1 through 3 and 5 through 7 are cross-sectional views of a portion of an integrated circuit shown at various stages of fabrication in accordance with a first embodiment of the present invention.

Referring to FIG. 1, there is shown a substrate 30 formed of a standard slice of semiconductive material preferably silicon having P-type semiconductivity and a resistivity of approximately 1 ohm cm; however, it is to be understood that N-type semiconductivity material could also be used. The slice is polished to attain a mono-crystalline surface 32. On surface 32, there is grown an epitaxial layer 34 of N-type semiconductivity material. The epitaxial layer 34 should be grown so that it has a high N+ impurity concentration adjacent surface 32 and a standard N impurity concentration throughout the remainder of the layer. The variation in impurity concentration may be achieved by growing the layer with a graded impurity concentration varying from a high N+ concentration initially to a lower N concentration at the termination of the growth. Alternatively two distinct layers may be grown such as layer 36 having a high N+ impurity concentration and layer 38 having a standard N impurity concentration.

The epitaxial layer may be grown using impurity atoms of phosphorous, arsenic or antimony which provide for the N-type semiconductivity of the layer. Layer 36 has a higher impurity concentration and is formed during an epitaxial process at a temperature of approximately 1200° C and an impurity concentration equal to or greater than 2 times $10^{17}$ atoms per ccm. This growth is continued for approximately one minute to provide a layer having a thickness of approximately 1 micron. The growth is then continued with an impurity concentration of approximately 1 times $10^{16}$ atoms per ccm for a period of approximately 7 minutes to form layer 38 having a thickness of approximately 6 to 7 microns. The above method provides for two distinct layers 36 and 38 having different impurity concentrations. If desired, a graded impurity concentration may be provided by growing the epitaxial layer for 1 minute with a concentration of 2 times $10^{17}$ or more impurity atoms per ccm and thereafter cutting off the impurity source while continuing the epitaxial growth. The residual impurity atoms form the graded concentration. The high N+ concentration in layer 36 provides a low saturation resistance allowing for high current density switching in the resulting semiconductor device.

The N-type conductivity layer 34 shown in FIG. 1 is preferably formed through the use of an epitaxial growth is previously described; however, for the purposes of the present invention, a diffusion step may be used to form the N+ layer 36 and thereafter layer 38 may be formed using a standard concentration epitaxial growth.

After forming the N-type conductivity layer 34, the semiconductive material is subjected to an oxidizing process so as to form a dielectric oxide layer 40 over the entire surface of the epitaxial layer.

While oxidizing the semiconductive material is the preferred method for providing the dielectric layer 40, the layer may be formed by deposition of silicon nitride or an oxide that is both a dielectric and resistant to silicon etch.

Figure 2:
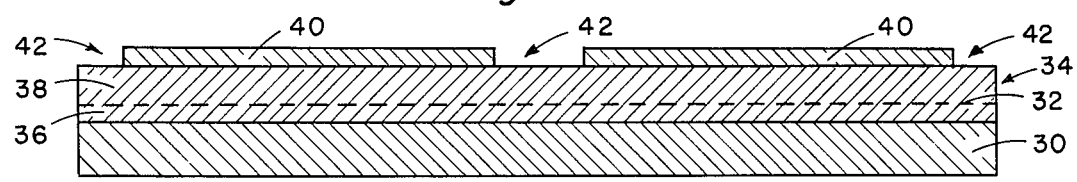
Figure 3:
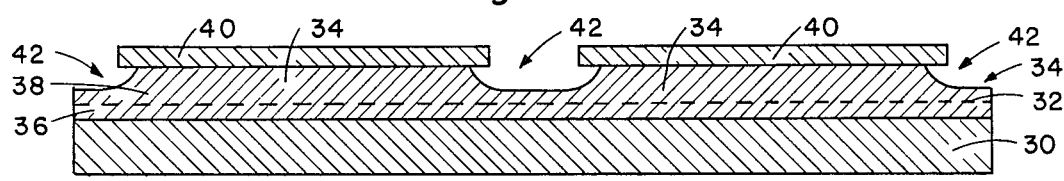

Using a conventional process, such as a photo-resist process, selected regions 42 of layer 40 are removed by etching to expose the N-type semiconductive material in layer 34. The remaining portions of layer 40 form a mask, as shown in FIG. 2. Using layer 40 as a mask, layer 34 may be etched in regions 42 to remove all or a portion of the N-type semiconductive material as shown in FIG. 3.

Figure 4:
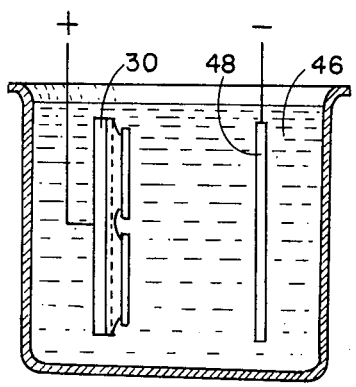
FIG. 4 is a diagrammatic representation of one step in the process of the present invention.

The exposed semiconductive material in regions 42 is selectively anodized to form a dielectric material for electrical isolation of the remaining portions of layer 34. During the anodization process, the semiconductive material in regions 42 forms an anode. This is accomplished by applying a positive potential directly to the semiconductive material while submerging the integrated circuit in an anodizing solution containing an electrolyte 46 and a cathode 48 as shown in FIG. 4.

It may be desirable to protect the back side of the integrated circuit to prevent anodization. This may be provided by developing an oxide layer similar to layer 40 on the back side. If this is not done, the only adverse effect will be the development of an anodic film on the back side of the integrated circuit which will have little effect unless the substrate is very thin.

In the fabrication of the embodiment being described, it is essential that regions 42 and the spaces between the isolated portions of layer 34 be entirely filled with a dielectric material. In order to completely fill the spaces in regions 42, it is essential that the anodic film 50 shown in FIG. 5 be established to a thickness at least equal to that of layer 34 which may be 7 to 8 microns thick.

The anodic film may develop to a sufficient thickness by using either of two anodizing processes. Firstly, a process may be used that develops a porous anodic film so that anodization continues until a relatively thick film is developed. Secondly, an exothermic type of anodization may be used to rapidly develop a thick film of dielectric material.

In the first type of anodization, a porous anodic film is developed by selecting an electrolyte from the type that etches the anodic film at an appreciable rate so as to form pores. If the electrolyte does not have this characteristic, only a thin electrical insulating anodic film will be formed and unanodized semiconductive material will remain beneath the surface in regions 42 causing an electrical short between adjacent portions of N-type layer 34.

It was determined that electrolytes formed of acids, chlorox ($NaClO_4$) and ammonium borate would form porous anodic films that could be grown to a sufficient thickness to fill regions 42. A porous anodic film may be formed using almost any acidic electrolyte in the proper concentration with the proper temperature and current. Electrolytes made from boric, sulfuric, nitric and phosphoric acids proved to be particularly useful. Generally speaking, hydrofluoric acid was found to be too strong in that it too rapidly atacked the oxide layer 40 and also caused the anodic film to peel off after formation of thin layers. The concentration and selection of the electrolyte solution may vary depending upon the thickness of the layer to be established and other design considerations. The details of the anodization processes will be discussed subsequently.

Figure 5:
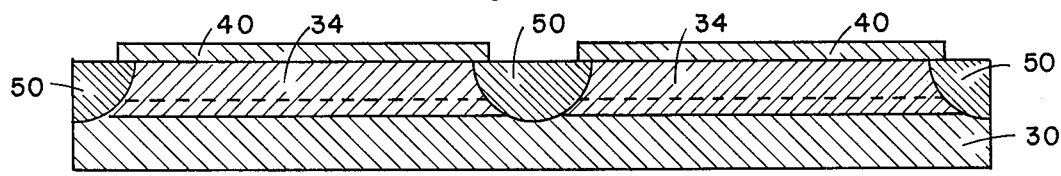

During anodization, the semiconductive material experiences an increase in volume; therefore, the semiconductive material in regions 42 may be etched away prior to anodization as shown in FIG. 3 so that the resulting anodic material 50 has a surface in the same plane as the surface of regions 34 as shown in FIG. 5. Alternatively, the etching step may be eliminated and the excess anodized material may be removed easily using a 10% solution of hydrofluoric acid.

The anodized material is a dielectric and therefore provides complete electrical isolation between the semiconductive material in the remaining portions of layer 34. The use of this type of dielectric material for isolation between active regions of the integrated circuit minimizes the parasitic capacitance associated with the PN junction type of isolation used in the prior art.

Figure 8:
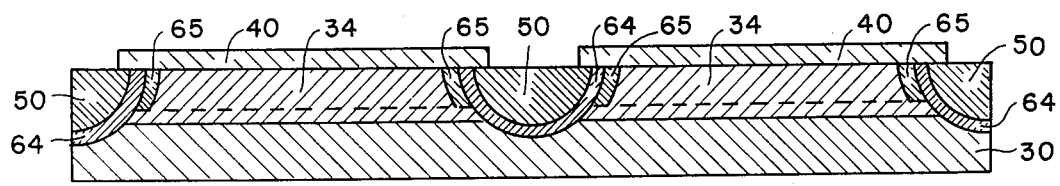
FIG. 8 is a cross-sectional view of a portion of an integrated circuit in accordance with a second embodiment of the present invention.

The anodized material is very porous and may be hardened to prevent the diffusion of impurities into and through the isolation region. Hardening may be accomplished by heating so as to fully oxidize the anodic material. Hardening may also be an inherent result of subsequent high temperature steps such as the formation of base regions. During such subsequent steps, the unanodized semiconductive material is oxidized to form an oxide layer 64 under the porous anodic film as shown in FIG. 8. This oxide layer prevents impurities from degrading the semiconductive material.

Figure 6:
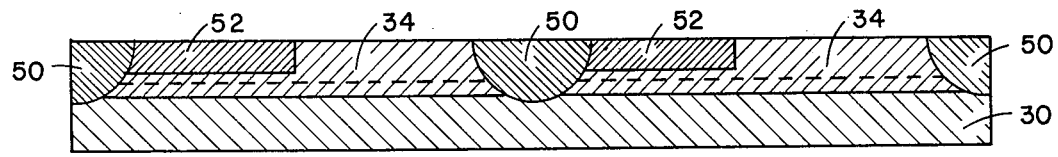
Figure 7:
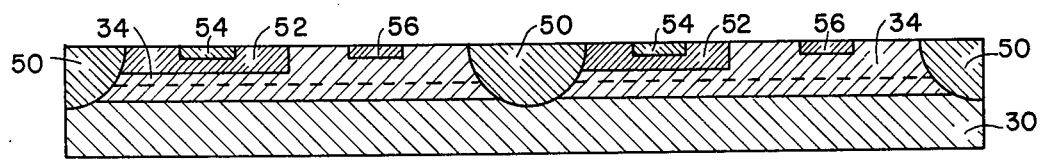

Referring to FIG. 6, the circuit is shown having a plurality of base regions 52 formed of P-type semiconductive material. The base regions 52 are formed by using a photo-resist process to etch an oxide layer to form an oxide mask defining regions 52. P-type impurities are then diffused into regions 52. The P-type impurities may be atoms of boron or any other well-known P-type impurity. After formation of the base regions 52, a photo-resist process is again used to form an oxide mask for defining regions to be diffused with N-type impurities to form N-type semiconductivity regions as shown in FIG. 7. N-type semiconductivity regions 54 function as emitter elements and regions 56 provide surfaces for ohmic collector contacts.

It should be apparent to one skilled in the art that the process previously described may be somewhat varied while still practicing the inventive concepts. The P and N type semiconductivity regions may be switched to form a circuit having opposite type conductivity transistors. The base, emitter and ohmic contact regions may also be diffused into the epitaxial layer 34 prior to the formation of the isolation regions 42.

During fabrication of the circuit, it may be that N-type impurities become diffused into the P-type substrate 30. In order to prevent the possible inversion of the P-type substrate, it may be desirable to subject the circuit as shown in FIG. 5 to a short diffusion period of P-type impurity such as boron. The impurities quickly diffuse evenly through the porous anodic material and some are further diffused into the semiconductive material adjacent the anodic film. The P-type impurity diffused into the N-type semiconductive material in layer 38 may be sufficient to invert a portion 65 of the N-type semiconductive material in layer 38 to P-type as shown also in FIG. 8. The previously mentioned oxidation step wherein layer 64 is formed may be combined with the P-type diffusion step wherein layer 65 is formed by oxidizing in a boron doped environment to provide an oxide layer similar to layer 64 that contains P-type impurities.

Figure 9:
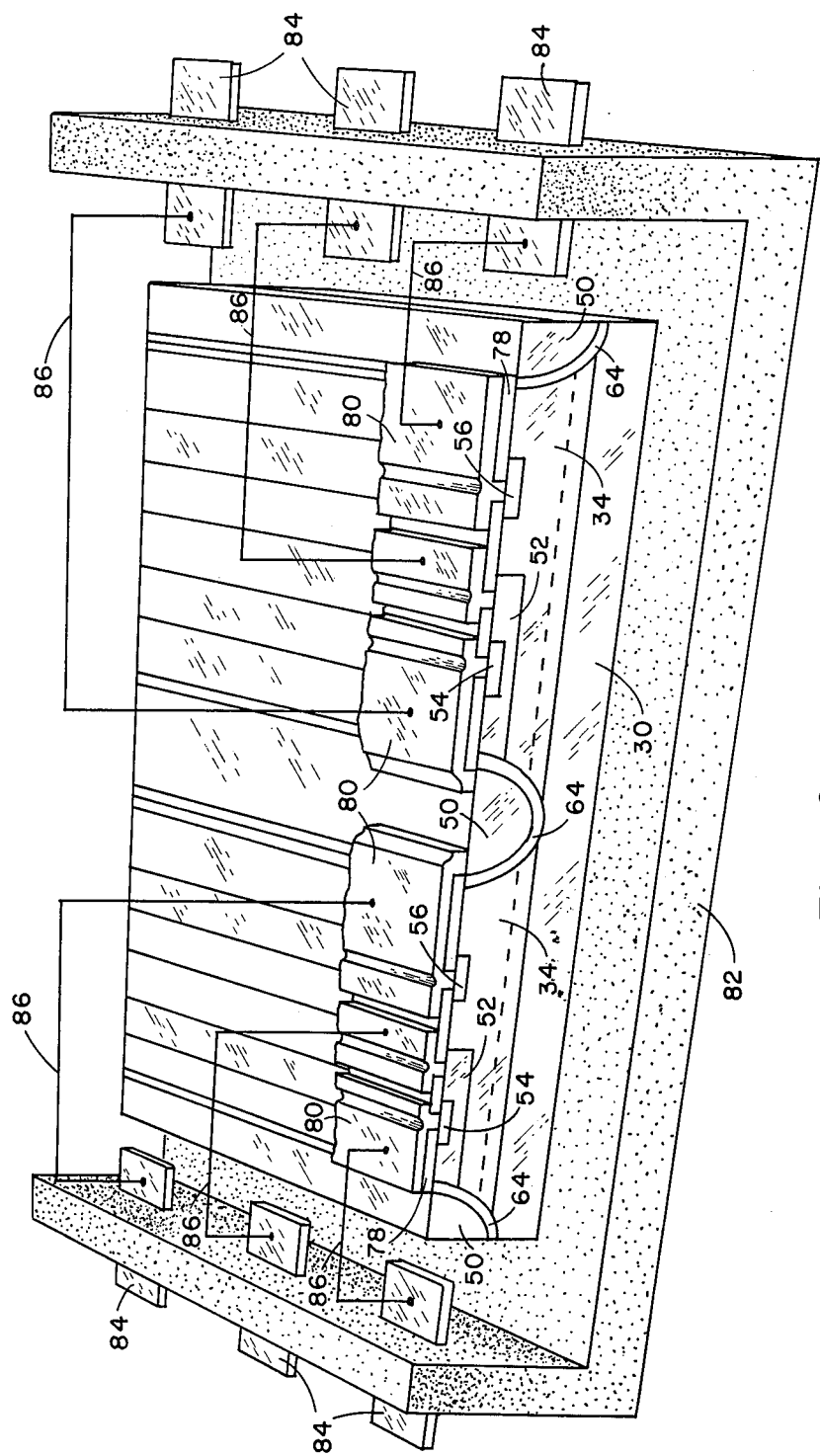
FIG. 9 is a cross-sectional view showing an encapsulated integrated circuit.

After formation of the base, emitter and ohmic contact regions, the circuit is in condition for testing and further processing which includes encapsulation into one of many types of available packages. Referring to FIG. 9, there is shown one example of an encapsulated integrated circuit. The integrated circuit as shown in FIG. 7 is provided with base, emitter and collector contacts. When forming these contacts selected portions of an oxide layer 78 which was formed during a previous step are removed over the desired contact points. Using aluminum metallization, an aluminum 80 is evaporated over the entire device so as to make contact with the exposed semiconductive material at the contact points. The aluminum is removed from undesired areas using a photo-resist process so that the contacts may be isolated from each other.

The integrated circuit is then mounted on the base of a package 82 which is usually formed of a glass like material depending on the requirements of the device. The package has contact leads 84 extending therethrough to which the contact points of layer 80 are connected by fine wire bonds 86. The package is then closed using any of a number of well known techniques.

In general, there are many ways of performing the anodization step of the present invention. Many types of electrolytes are available that may be used at various temperature and current conditions to achieve a desired result. It was determined that standard controlled anodization using an acidic electrolyte at voltage and current levels below the breakdown voltage of the anodic film resulted in preferred anodization adjacent the edge of the oxide mask. The preferred anodization resulted in a greater depth of anodized material in the region adjacent the oxide mask area and exhibited increased swelling in this area also. Consequently, it was difficult to achieve a planar surface upon termination of the anodization step and an additional process for removing anodic material was required to maintain the surface level. The reasons for the preferred anodization adjacent the oxide mask are not readily understood.

During experimentation it was discovered that a rapid type of anodization could be initiated if the applied potential was increased to a level at which the anodic film would break down. The rapid type of anodization resembles an exothermic reaction and is very fast, thereby substantially reducing the time required for anodization. The anodized material produced during the rapid type of anodization is a porous compound much like pumice. Test results indicate that the reaction will take place in almost any current carrying electrolyte and that acidic electrolytes are not required to obtain a porous anodic film.

It was also discovered that the rapid type of anodization also resulted in preferential anodization about the edge of the mask where the anodic film tended to breakdown first. For wide anodized regions, the center portion developed the usual anodic film having a thickness of less than 1 micron. If additional potential was applied, the center portion would also breakdown thereby rapidly anodizing the entire region. For the purposes of the present invention as applied to integrated circuits, the anodized regions are small enough so that the characteristic does not create a problem. For the size isolation regions used in integrated circuits, it may be generally considered that the depth of anodization is approximately equal to the width of the opening in the oxide mask. Thus, the width of region 42 shown in FIG. 2 must be at least equal to the thickness of the N-type semiconductive material in layer 34 if anodization is to take place without the prior etching of region 42. Since the swelling of the anodized silicon is difficult to control in the exothermic type of reaction, it is preferable to skip the etching step as shown in FIG. 3 and proceed with the anodization of the silicon within region 42 and thereafter remove the excess anodized material using a dilute solution of hydrofluoric acid.

Experiments were conducted using electrolytes containing the following acids: boric, sulfuric, nitric and phosphoric.

A dilute boric acid electroltye was formed by mixing 100 milligrams of boric acid crystals with 3,000 milliliters of deionized water. The electrolyte solution was heated to between 50° to 100° C and a silicon wafer having an oxide mask formed thereon was anodized approximately for 15 minutes at a voltage of between 50 and 500 volts. A voltage of 500 volts resulted in a 500 milliamp current when the electrodes were spaced 4 inches apart in the anodizing solution. The above parameters are all interdependent and may be varied considerably.

Figure 10:
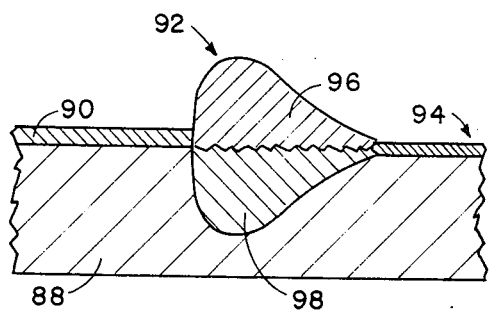
FIG. 10 is a cross-sectional view of a portion of a silicon wafer that has been exothermically anodized.

Preferential anodization occurred around the edge of the oxide mask as shown in FIG. 10. When additional current was applied, the anodic film in the center of regions 42 also broke down and the silicon anodized rapidly similar to the silicon at the edge of the oxide mask thereby substantially eliminating the preferential anodization. The silicon was anodized rapidly, at the rate of 4 microns within 10 minutes, and the anodized silicon swelled above the surface level of the oxide mask as shown in FIG. 10.

Referring to FIG. 10, there is shown a sectional view of a portion of a silicon wafer after being exothermically anodized. A silicon slice 88 having an oxide mask 90 was subjected to exothermic anodization as previously discussed in a boric acid electrolyte. Preferred anodization resulted in a swelled region 92 of anodic material about the edge of the mask and the usual anodic film 94 in the central region. Swelled region 92 comprises two distinctly different types of anodized material, above and below the original level of the silicon. Above the silicon level there is a soft material 96 that etches rapidly in dilute, 10%, hydrofluoric acid and hard material 98 that etches much slower. Material 96 etches at about 10 times the rate of oxide 90 while material 98 etches at about 2 times the rate of oxide 90. Both types of material are dielectric and extremely porous allowing oxygen and impurities to diffuse rapidly therethrough.

Due to the rapid etching characteristic of material 96 the material extending above the surface of the integrated circuit may be readily removed by etching to again develop a planar surface.

When using sulfuric acid in the electrolyte at 40 and 50% concentrations at both room temperature and 100° C a degree of preferential anodization was experienced at the edge of the oxide mask but this was not as pronounced as when boric acid was used. The anodization rate was found to be faster at 100° C than at room temperature for the same current density.

It was also discovered that when high power levels were applied such as more than a kilowatt of power an anodic material was developed that exhibited a unique characteristic. The material would not etch in hydrofluoric acid, in fact to date the inventors have not found anything that would etch the material.

An electrolyte comprising 40% nitric acid in deionized water was tested at room temperature and it was found that the exothermic type of anodization reaction was possible when sufficient current was applied. The anodization appeared to be much more uniform than that experienced with sulfuric acid.

Figure 11:
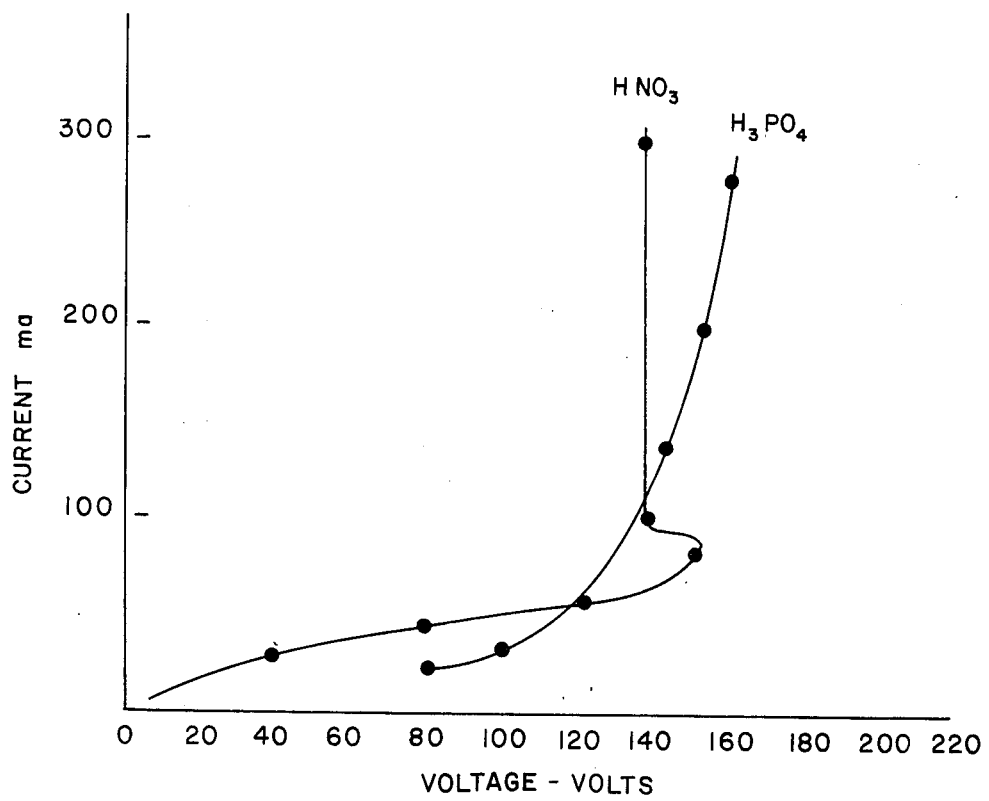
FIG. 11 is a graph showing the voltage-current characteristics of various electrolytes.

Referring to FIG. 11, there is shown a plot of the V/I characteristic displayed when nitric acid was used in the electrolyte. A distinct knee is shown in the curve so that below the knee a normal controlled rate of anodization is experienced which develops a standard non porous submicron anodic film while above the knee the exothermic type of reaction takes place. Since the two modes are distinctly separated and do not merge into each other, anodization can be selected for either the fast or slow rate without fear of sliding into the fast exothermic type of reaction.

A phosphoric acid electrolyte was formed having a 40% phosphoric acid concentration is deionized water. It was determined that at room temperature anodization was easiest using a phosphoric acid electrolyte; however, at 100° C poor results were experienced. The V/I curve was smooth and did not contain any disruption between the slow and fast anodization modes. Thus, it was found that the fast mode of anodization could easily be induced when the phosphoric acid electrolyte is used.

Thus, boric acid would appear to be a preferred type of electrolyte when fast deep and selective exothermic anodization is desired. When it is desired to achieve fast anodization of large areas, phosphoric acid is preferred since it provides a more even anodization over large areas. Sulfuric acid may be used at high power levels when a nonetchcable anodic material is desired.

It is clear that the electrolyte to be used depends upon the desired result since the various electrolytes produce different types of anodization reactions.

When practicing the invention using exothermic anodization, the back side of the substrate may or may not be protected. The anodic film that is developed, if not protected, will be of limited thickness since there are no oxide edges where the deep preferred anodization would be experienced.

The additional steps relating to boron diffusion and hardening of the anodic material should be performed no matter what type of anodization is used.

Thus, the present invention provides a method for forming isolation regions in semiconductor material using an anodized silicon. When the process is used, in the fabrication of integrated circuits, high temperature diffusion steps are eliminated along with a masking operation. The use of a dielectric material as an insulator between active elements in an integrated circuit provides advantages over the prior art, in particular it eliminates the problems encountered with the parasitic capacitance associated with the PN junctions used for isolation in the prior art. Thus, the present invention provides for less expensive integrated circuits having improved operating characteristics.

What is claimed is:

1. A method for providing electrical isolation regions in a semiconductive material, comprising the steps of:
   forming a protective layer on a surface of the semiconductive material;
   removing the protective layer in said regions to expose the semiconductive material; and
   forming a porous dielectric material from at least a portion of the semiconductive material in the regions by submerging the semiconductive material into an anodizing solution and applying and anodizing potential to the semiconductive material so that the exposed semiconductive material in the regions becomes an anode and is at least partially anodized to form the porous dielectric insulating material in the regions, the porosity of said dielectric material being sufficient to allow the anodizing solution to penetrate the dielectric and react with the unanodized semiconductive material in said regions, whereby the isolation regions may be formed to a desired thickness.

2. A method as described in claim 1, additionally comprising the step of oxidizing the semiconductive material to form an oxide layer at the interface of the porous dielectric material and the semiconductive material to prevent impurities from being diffused into the semiconductive material through the porous dielectric material.

3. A method as described in claim 1, wherein the porous dielectric material is formed to a depth sufficient so that the porous dielectric material fills the regions and isolates the remaining semiconductive material.

4. A method as described in claim 1, additionally comprising the step of removing a portion of the semiconductive material in the regions prior to forming the porous dielectric material.

5. A method as described in claim 4, wherein the semiconductive material is removed by etching with an etch that attacks the semiconductive material more readily than the protective layer.

6. A method as described in claim 4, wherein the porous dielectric material is formed to a depth sufficient so that the porous dielectric material fills the regions and isolates the remaining semiconductive material.

7. A method as described in claim 1, wherein the semiconductive material comprises a substrate layer of a first semiconductivity type material and another layer formed thereon of a second semiconductivity type material, wherein the second semiconductivity type material in the regions is anodized to provide porous dielectric material between the remaining portions of the second semiconductivity type material.

8. A method as described in claim 7, additionally comprising the step of diffusing a first semiconductivity type dopant into and through the porous dielectric material to prevent subsequent inversion of the substrate layer to the second type conductivity.

9. A method as described in claim 8, additionally comprising the step of oxidizing the semiconductive material to form an oxide layer at the interface of the porous dielectric material and the semiconductive material to prevent impurities from being diffused into the semiconductive material through the porous dielectric material.

10. A method as described in claim 1, wherein the anodizing solution contains an acid.

11. A method as described in claim 1, wherein the anodizing solution contains an acid selected from a group including sulfuric, phosphoric, boric and nitric acids.

12. A method as described in claim 1, wherein excess porous dielectric material resulting from swell is removed using an etching solution.

13. A method as described in claim 1, wherein the anodizing potential is increased to a level at which the porous dielectric material electrically breaks down causing rapid anodization of the semiconductive material.

14. A method as described in claim 13, wherein the depth of anodization is controlled by the width of said regions.

15. A method as described in claim 1, wherein the anodizing solution is selected from a group of solutions including chlorox and ammonium borate solutions.

16. A method as described in claim 1, wherein the anodizing solution used is one that etches the dielectric material at a rate sufficient to form pores in said material to allow penetration of the anodizing solution into the dielectric material where it may react with the unanodized semiconductive material.

17. A method of fabricating a semiconductor device comprising the steps of:
   forming on the surface of a body of semiconductive material of a first semiconductivity type a layer of second semiconductivity type material, said layer having a high concentration of impurities on a side adjacent the body and a lower concentration on a side opposite said body;
   forming a protective layer on said layer of second semiconductivity type material;
   removing said protective layer from selected regions to expose the semiconductive material;
   forming a porous dielectric material from at least a portion of the semiconductive material in the selected regions by submerging said device in an anodizing solution and applying an anodizing potential to the semiconductive material in the regions so that the exposed semiconductive material becomes an anode and is at least partially anodized to form the porous dielectric insulation in the regions, the porosity of said dielectric material being sufficient to allow the anodizing solution to penetrate the dielectric and react with the unanodized semiconductive material in said regions, whereby the isolation regions may be formed to a desired thickness;

removing said device from the anodizing solution;

forming regions of first semiconductivity type material in the layer of second semiconductivity type material; and forming zones of second type semiconductivity material in said regions of first type semiconductivity material.

18. A method as described in claim 17, additionally comprising the step of encapsulating said body and providing electrical connections to desired portions thereof.

19. A method as described in claim 17, wherein the step of forming a layer of second semiconductivity type material comprises the steps of forming a first layer of second semiconductivity type material having a high concentration of impurities and forming a second layer of second semiconductivity type material having a lower concentration of impurities.

20. A method as described in claim 17, wherein the step of forming a layer of second semiconductivity type material comprises the step of growing an eptiaxial layer of second semiconductivity type material in such a manner as to provide a varying concentration of impurities from a high concentration adjacent the body to a lower concentration at an opposite side remote from said body.

21. A method as described in claim 17, additionally comprising the step of oxidizing said semiconductive material to form a non-porous oxide layer at the interface of the porous dielectric insulation and the semiconductive material to prevent impurities from being diffused into the semiconductive material.

22. A method as described in claim 17, wherein all of the second semiconductivity type material in the second layer is anodized in the selected regions to form the porous dielectric material and isolate the remaining portions of second semiconductivity type material.

23. A method as described in claim 17, additionally comprising removing a portion of the semiconductive material in said regions prior to anodizing.

24. A method as described in claim 17, additionally comprising the step of diffusing a first type of semiconductive impurity into and through the porous dielectric insulation to prevent inversion of the body of semiconductive material to the second type of semiconductivity.

25. A method as described in claim 24, additionally comprising the step of oxidizing the semiconductive material thereby forming an oxide layer at the interface of the porous dielectric insulation and the semiconductive material.

26. A method as described in claim 24, additionally comprising the step of encapsulating said body and providing electrical connections to desired portions thereof.

27. A method as described in claim 17, wherein the regions of first semiconductivity type material and the zones of second type semiconductive material are formed prior to forming the porous dielectric material in the selected regions.

28. A method as described in claim 17, wherein the regions of first semiconductivity type material and the zones of second type semiconductive material are formed after forming the porous dielectric material in the selected regions.

29. A method as described in claim 19, wherein the anodizing potential is increased to a level at which the porous dielectric material electrically breaks down causing rapid anodization of the semiconductive material.

30. A method as described in claim 29, wherein the depth of anodization is controlled by the width of the selected regions.

31. A method as described in claim 17, additionally comprising the step of removing excess porous dielectric insulation by etching.

32. A method as described in claim 17, wherein the anodizing solution contains an acid.

33. A method as described in claim 17, wherein the anodizing solution contains an acid selected from a group including sulfuric, phosphoric, boric and nitric acids.

34. A method as described in claim 17, wherein the anodizing solution is selected from a group of solutions including chlorox and ammonium borate solutions.

35. A method as described in claim 17, wherein the anodizing solution used is one that etches the dielectric material at a rate sufficient to form pores in said material to allow penetration of the anodizing solution into the dielectric material where it may react with the unanodized semiconductive material.

36. A method for providing electrical isolation regions in a semiconductive material, comprising the step of:

forming a porous dielectric material from at least a portion of the semiconductive material in the regions by anodizing at least a portion of the semiconductive material in the regions in an anodizing solution, the porosity of said dielectric material being sufficient to allow the anodizing solution to penetrate the dielectric and react with the unanodized semiconductive material in said regions, whereby the isolation regions may be formed to any desired thickness.

37. A method as described in claim 36, wherein an anodizing potential is applied at a level that causes the porous dielectric material to break down electrically.

38. A method as described in claim 36, wherein the anodizing solution used is one that etches the dielectric material at a rate sufficient to form pores in said material to allow penetration of the anodizing solution into the dielectric material where it may react with the unanodized semiconductive material.

39. A method as described in claim 38, wherein the anodizing solution is selected from a group of solutions including sulfuric acid, phosphoric acid, boric acid, nitric acid, clorox and ammonium borate.

* * * * *